(12) United States Patent
Gerhard et al.

(10) Patent No.: US 7,838,126 B2
(45) Date of Patent: *Nov. 23, 2010

(54) ORGANIC ELECTRONIC DEVICES

(75) Inventors: Anja Gerhard, Veitschöchheim (DE);
Horst Vestweber, Gilserberg (DE);
Philipp Stössel, Frankfurt (DE)

(73) Assignee: Merck Patent GmbH, Darmstadt (DE)

( * ) Notice: Subject to any disclaimer, the term of this patent is extended or adjusted under 35 U.S.C. 154(b) by 352 days.

This patent is subject to a terminal disclaimer.

(21) Appl. No.: 10/589,847

(22) PCT Filed: Feb. 18, 2005

(86) PCT No.: PCT/EP2005/001709

§ 371 (c)(1),
(2), (4) Date: Aug. 18, 2006

(87) PCT Pub. No.: WO2005/084081

PCT Pub. Date: Sep. 9, 2005

(65) Prior Publication Data

US 2007/0164273 A1    Jul. 19, 2007

(30) Foreign Application Priority Data

Feb. 20, 2004   (DE) ................. 10 2004 008 304

(51) Int. Cl.
*H01L 51/54* (2006.01)

(52) U.S. Cl. ................. 428/690; 428/917; 313/504; 313/506; 252/301.16; 257/40; 257/103; 136/263; 568/305; 568/308

(58) Field of Classification Search .......... 248/690, 248/917; 313/504, 506; 257/40, E51.044
See application file for complete search history.

(56) References Cited

U.S. PATENT DOCUMENTS

| 5,378,519 | A | | 1/1995 | Kikuchi et al. |
| 5,755,999 | A | * | 5/1998 | Shi et al. ............... 252/301.16 |
| 2003/0008174 | A1 | * | 1/2003 | Suzuki et al. ............... 428/690 |
| 2003/0168970 | A1 | * | 9/2003 | Tominaga et al. ........... 313/504 |

FOREIGN PATENT DOCUMENTS

| EP | 0 650 955 | 5/1995 |
| EP | 0 786 926 | 7/1997 |
| JP | 6-192654 | 7/1994 |
| JP | 8-143862 | 6/1996 |
| JP | 9-255774 | 9/1997 |
| JP | 2002-203684 | 7/2002 |
| JP | 2002-260863 | 9/2002 |
| WO | WO-2004/013080 | 2/2004 |
| WO | WO-2004/093207 | 10/2004 |

OTHER PUBLICATIONS

Machine translation of JP 06/192654 A (1996).*

Schonberg et al., "Extremely Reactive Carbon-Carbon Double Bond-I, Reactions With 2-(9-Xanthylidene)-, 2-(-Thioxanthylidene)-, and 2-(9- Fluorenylidene)-Indane-1, 3-Dione, A Contribution on the Structure and Reactivity of Non-Planar C-C Double Bonds", *Tetrahedron*, vol. 39, No. 14, pp. 2429-2437 (1983).

DiBiase et al., "Direct Synthesis of α,β-Unsaturated Nitriles from Acetonitrile and Carbonyl Compounds: Survey, Crown Effects, and Experimental Conditions", *J. Org. Chem.*, vol. 44, No. 25, pp. 4640-4649 (1979).

* cited by examiner

*Primary Examiner*—D. Lawrence Tarazano
*Assistant Examiner*—Michael Wilson
(74) *Attorney, Agent, or Firm*—Connolly Bove Lodge & Hutz LLP

(57) ABSTRACT

The present invention relates to the improvement of organic electronic devices, in particular fluorescent electroluminescent devices, by using electron-transport materials of the formula (I).

10 Claims, 1 Drawing Sheet

Determination of the absorption edge of E1

ORGANIC ELECTRONIC DEVICES

RELATED APPLICATIONS

This application is national stage application (under 35 U.S.C. 371) of PCT/EP2005/001709 filed Feb. 18, 2005, which claims benefit to German application 10 2004 008 304.5 filed Feb. 20, 2004.

The present invention describes the use of certain compounds in organic electronic devices.

The use of organic semiconductors has been reality for some time or is expected in the near future in a number of different applications which can be ascribed to the electronics industry in the broadest sense. The use of semiconducting organic compounds which are capable of the emission of light in the visible spectral region is just at the beginning of the market introduction, for example in organic electroluminescent devices. For simple devices containing OLEDs, the market introduction has already taken place, as confirmed by the car radios from Pioneer, the mobile telephones from Pioneer and SNMD and a digital camera from Kodak with an "organic display". Further products of this type are just about to be introduced. Organic solar cells (O-SCs), organic field-effect transistors (O-FETs), organic thin-film transistors (O-TFTs), organic integrated circuits (O-ICs), organic optical amplifiers or organic laser diodes (O-lasers) are well advanced at a research stage and could achieve major importance in the future.

The general structure of organic electroluminescent devices (OLEDs) is described, for example, in U.S. Pat. Nos. 4,539,507, 5,151,629, EP 0676461, WO 98/27136 and in WO 04/058911, where these devices usually consist of a plurality of layers. Organic solar cells (for example WO 98/48433, WO 94/05045), organic field-effect transistors (for example U.S. Pat. Nos. 5,705,826, 5,596,208, WO 00/42668), organic thin-film transistors, organic integrated circuits (for example WO 95/31833, WO 99/10939), organic optical amplifiers or organic laser diodes (for example WO 98/03566) have a similar general structure.

However, there are still considerable problems which require urgent improvement:

1. The efficiency has been improved in recent years, but is still too low, in particular in fluorescent OLEDs, and has to be improved.
2. The operating voltage and operating current are fairly high, in particular in fluorescent OLEDs, and therefore have to be reduced further in order to improve the power efficiency. This is of major importance, in particular for mobile applications.
3. The operating lifetime of the electronic devices is still short, meaning that it has hitherto only been possible to achieve simple applications commercially.
4. For many applications, as described below, thicker electron-transport layers are required than can be achieved using the materials used to date, since the charge-carrier mobility of these materials is inadequate.
5. The most-used electron conductor, $AlQ_3$, has various disadvantages, which are detailed below.

For many applications, it would be desirable to be able to use relatively thick layers of an electron-transport material. This would have the advantage that the occurrence of short circuits could thereby be reduced or even prevented entirely. Furthermore, this applies in particular if a combination of fluorescent blue and phosphorescent red and green OLEDs is used in displays. Since the phosphorescent OLEDs generally have a thicker layer structure, the fluorescent blue OLED must comprise a thicker electron-transport layer in order that the various OLEDs have the same total thickness. However, since the electron mobility of the electron-transport compounds in accordance with the prior art is inadequate for this purpose, this is still not possible in practice.

Electroluminescent devices which use $AlQ_3$ as electron conductor have already been described in 1983 in U.S. Pat. No. 4,539,507; $AlQ_3$ has since then been employed as electron-transport material in most OLEDs. In the above-mentioned application, it is used as electron-transport material in the emission layer. However, $AlQ_3$ has a number of disadvantages: it cannot be vapour-deposited without leaving a residue since it partially decomposes at the sublimation temperature, which represents a major problem, in particular for production plants. This has the consequence that the vapour-deposition sources continually have to be purified or changed. Furthermore, decomposition products of $AlQ_3$ enter the OLED, where they contribute to a shortened lifetime and reduced quantum and power efficiency. A crucial practical disadvantage is the high hygroscopicity of $AlQ_3$. Synthesised and stored under normal conditions, $AlQ_3$ still contains, besides the hydroxyquinoline ligands, one molecule of water per complex molecule (H. Schmidbaur et al., Z. Naturforsch. 1991, 46b, 901-911), which is extremely difficult to remove. For use in OLEDs, $AlQ_3$ therefore has to be purified in a complex manner in complicated, multistep sublimation processes and subsequently stored and handled in a protective-gas atmosphere with exclusion of water. Furthermore, large variations in the quality of individual $AlQ_3$ batches and poor storage stability have been observed (S. Karg, E-MRS Conference 30.5.00-2.6.00, Strasbourg). In addition, $AlQ_3$ has low electron mobility, which results in higher voltages and thus in lower power efficiency. In order to prevent short circuits in the display, it would, as described above, be desirable to increase the layer thickness; this is not possible with $AlQ_3$ owing to the low charge-carrier mobility and the resultant increase in voltage. The charge-carrier mobility of other electron conductors (U.S. Pat. No. 4,539,507) is likewise too low in order to build up relatively thick layers therewith, with the lifetime of the OLED being even worse than on use of $AlQ_3$. Another very unfavourable factor proves to be the inherent colour of $AlQ_3$ (yellow in the solid state), which can result, in particular in blue OLEDs, in colour shifts due to re-absorption and weak re-emission. It is only possible to produce blue OLEDs here with considerable reductions in efficiency and shifts in colour location. A further disadvantage of the use of $AlQ_3$ is the instability to holes (Z. Popovic et al., Proceedings of SPIE 1999, 3797, 310-315), which, on long-term use, can always result in problems in the component. In spite of the said disadvantages, $AlQ_3$ to date still represents the best compromise for the various requirements of an electron-transport material in OLEDs. A satisfactory electron-transport material has likewise not been found to date for the other applications mentioned.

The use of certain ketones in OLEDs has already been described in detail in the literature (for example JP 6192654 or JP 406100857). However, the compounds used therein also have the disadvantage that they have an inherent colour, which, especially in the case of blue OLEDs, results in colour shifts or at least in reduced efficiency due to re-absorption. The known compounds thus do not represent an advantage over $AlQ_3$ for use in blue OLEDs. Since it is preferred for the industrial production of OLEDs to use the same electron conductor for all colours, these compounds do not represent a usable alternative to $AlQ_3$ for other emission colours either.

The demand thus continues for electron-transport materials which result in good efficiencies and at the same time in long lifetimes in organic electronic devices. Surprisingly, it has now been found that organic electronic devices which comprise certain compounds—mentioned below—as electron-transport materials have significant improvements over the prior art. These materials enable high efficiencies and long lifetimes to be obtained simultaneously, which is not possible with materials in accordance with the prior art. In addition, it has been found that additionally the operating voltages can be reduced significantly compared with $AlQ_3$, which corresponds to higher power efficiencies, and that thicker electron-transport layers can be used, which reduces the frequency of short circuits or prevents them and is accompanied by further advantages mentioned above.

DESCRIPTION OF THE INVENTION

Figure 1:
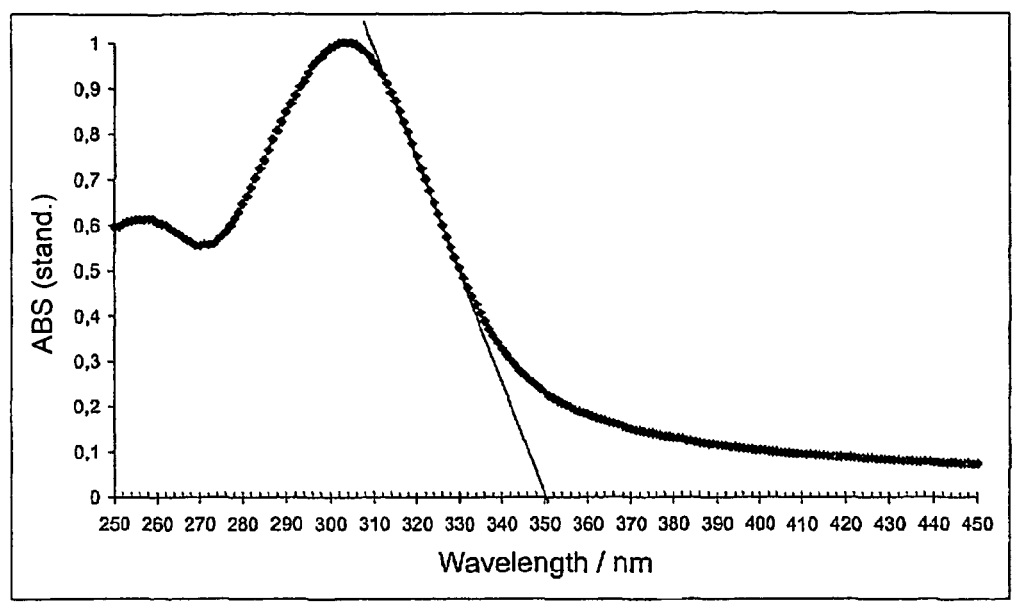
FIG. 1 graphically depicts the determination of the absorption edge of electron transport material E1.

The invention relates to an organic electronic device comprising cathode, anode and at least one organic layer, characterised in that the organic layer comprises at least one compound of the formula (1)

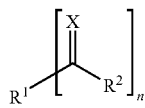

Formula (1)

where the following applies to the symbols used:
X is on each occurrence, identically or differently, O, S, Se, Te or NR;
R is on each occurrence, identically or differently, an organic radical having 1 to 22 carbon atoms, which may also be bonded to X via an O or N atom, or OH or $NH_2$;
$R^1$, $R^2$ are on each occurrence, identically or differently, an aromatic or hetero-aromatic ring system having 1 to 40 aromatic C atoms, which may be substituted by one or more radicals $R^3$, where the substituents $R^1$ and $R^2$ may form a mono- or polycyclic ring system with one another;
$R^3$ is on each occurrence, identically or differently, H, OH, $N(R^4)_2$, CN, $B(R^4)_2$, $Si(R^4)_3$, a straight-chain, branched or cyclic alkyl or alkoxy chain having 1 to 22 C atoms, in which, in addition, one or more non-adjacent C atoms may be replaced by $-R^4C=CR^4-$, $-C\equiv C-$, $Si(R^4)_2$, $Ge(R^4)_2$, $Sn(R^4)_2$, $-NR^4-$, $-O-$, $-S-$, $-CO-$, $-CO-O-$, $-O-CO-O-$ and where one or more H atoms may be replaced by fluorine, or an aryl, heteroaryl or aryloxy group having 1 to 40 C atoms, which may also be substituted by one or more radicals $R^4$, or a combination of 2, 3 or 4 of these systems; two or more radicals $R^3$ here may also form a ring system with one another;
$R^4$ is on each occurrence, identically or differently, H or an aliphatic or aromatic hydrocarbon radical having 1 to 20 C atoms;
n is on each occurrence 1, 2, 3, 4, 5, 6, 7, 8, 9 or 10;

with the proviso that the compound of the formula (1) has a molecular weight of $\geq 150$ g/mol and $\leq 10,000$ g/mol and that the device does not comprise a phosphorescent emitter; and furthermore with the proviso that neither $R^1$ nor $R^2$ represents a substituted or unsubstituted spirobifluorene, characterised in that the absorption edge of the compound of the formula (1) is <400 nm.

For the purposes of this invention, absorption edge is taken to mean the following: if an inflexional tangent is placed in the longer-wavelength flank of the longest-wavelength absorption band between singlet states of the absorption spectrum (i.e. an $S_0 \rightarrow S_1$ transition) of a layer of this compound having a layer thickness of 100 nm and the intersection of this inflexional tangent with the abscissa is determined, the resultant wavelength gives the absorption edge of the compound.

The absorption edge of the compound of the formula (1) is preferably <380 nm.

For the purposes of this invention, an aromatic or heteroaromatic ring system will be taken to mean a system which does not necessarily contain only aromatic or hetero-aromatic groups, but in which two or more aromatic or heteroaromatic groups may also be interrupted by a short non-aromatic unit (preferably <10% of the atoms other than H, particularly preferably <5% of the atoms other than H), such as, for example, an $sp^3$-hybridised C, N or O atom. Thus, for example, systems such as 9,9-diarylfluorene, triarylamine, etc., will also be taken to be aromatic systems for the purposes of this application.

For the purposes of the present invention, a $C_1$- to $C_{22}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethyl-hexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$-to $C_{22}$-alkoxy group is particularly preferably taken to mean methoxy, ethoxy, n-propoxy, i-propoxy, n-butoxy, i-butoxy, s-butoxy, t-butoxy or 2-methylbutoxy. A $C_1$-$C_{40}$ aromatic or heteroaromatic ring system, which may also in each case be substituted by the above-mentioned radicals $R^3$, is in particular taken to mean groups derived from benzene, naphthalene, biphenylene, terphenylene, fluorene, dihydrophen-anthrene, tetrahydropyrene, cis- or trans-indenofluorene, furan, benzofuran, iso-benzofuran, dibenzofuran, thiophene, benzothiophene, isobenzothiophene, dibenzo-thiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For the purposes of this invention, electronic devices are preferably organic electroluminescent devices (organic light-emitting diodes, OLEDs), organic thin-film transistors (O-TFTs), organic field-effect transistors (O-FETs), organic solar cells (O-SCs), organic photoreceptors or organic lasers (O-lasers), in particular organic electroluminescent devices.

Preference is given to an organic electronic device, characterised in that the compound of the formula (1) is amorphous and the glass transition temperature $T_g$ of the compound is greater than 80° C., particularly preferably greater than 100° C., in particular greater than 130° C.

Particular preference is given to an organic electronic device, characterised in that X stands for O or NR, in particular for O.

Very particular preference is given to organic electronic devices, characterised in that the compounds of the formula (1) consist only of the elements carbon, hydrogen and oxygen.

In order to achieve an absorption edge <400 nm, it is preferred for the radicals $R^1$ and $R^2$ to contain no fused aromatic ring systems having three or more fused benzene units, i.e., for example, no anthracene, pyrene, phenanthrene, perylene, etc. Preference is thus given to a maximum of two fused benzene units. However, this does not exclude that these radicals may contain fused heteroaromatic ring systems having three or more fused rings, for example phenanthroline, acridine, etc.

It may also be preferred for the compound of the formula (1) to contain more than one carbonyl group. In this case, the arrangement of the carbonyl groups in the molecule may be linear or also branched, or they may also be arranged dendritically. Preference is given to compounds which have a dendritic structure. Preference is furthermore given to 1,3,5-trisubstituted benzenes. In this case, the radical $R^1$, for example, then represents a bridging group between two or more carbonyl functions.

Preferred compounds of the formula (1) are the compounds of the formulae (2) to (4):

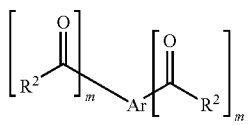

Formula (2)

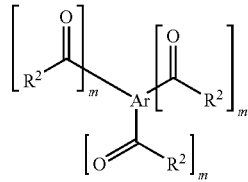

Formula (3)

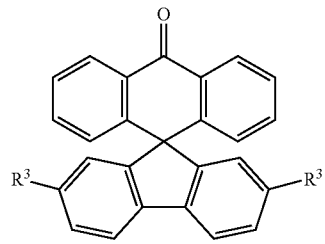

Formula (4)

where $R^2$ and $R^3$ have the same meaning as described above, and the following applies to the other symbols and indices used:

Ar is on each occurrence, identically or differently, a divalent (in formula (2)) or trivalent (in formula (3)) aromatic or heteroaromatic ring system having 3 to 24 aromatic C atoms, which may be substituted by one or more radicals $R^3$;

m is on each occurrence, identically or differently, 1, 2 or 3. m=2 or m=3 here denotes a linear link of two or three carbonyl functions via the group $R^2$.

Examples of preferred compounds of the formula (1) or of the formulae (2) to (4) are the following Examples 1 to 28:

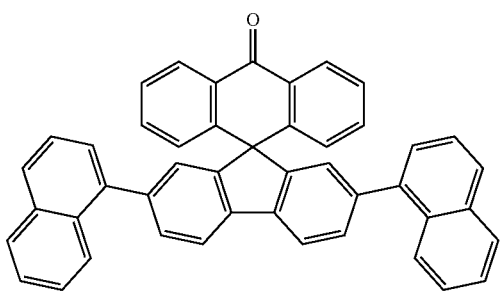

Example 1

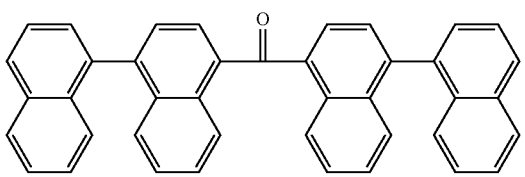

Example 2

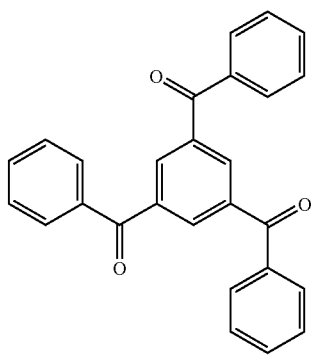

Example 3

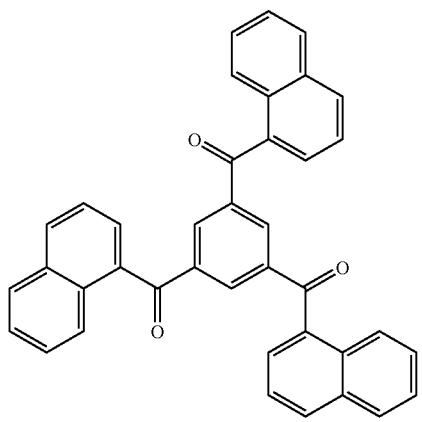

Example 4

-continued
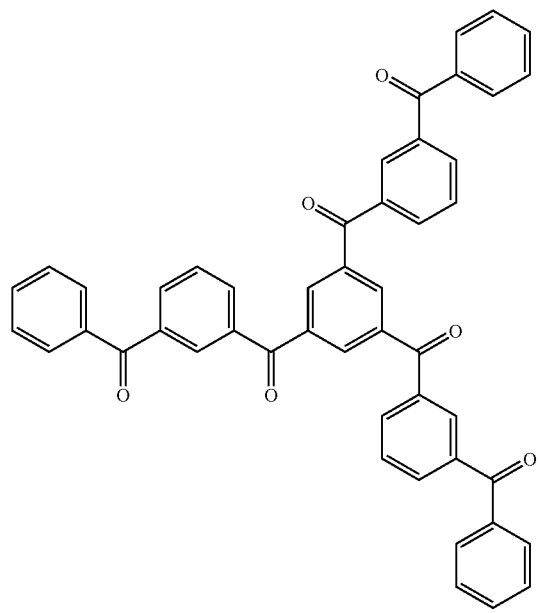
Example 5
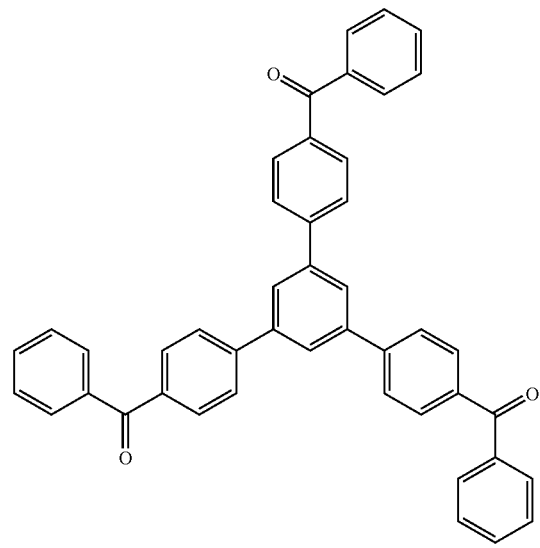
Example 6
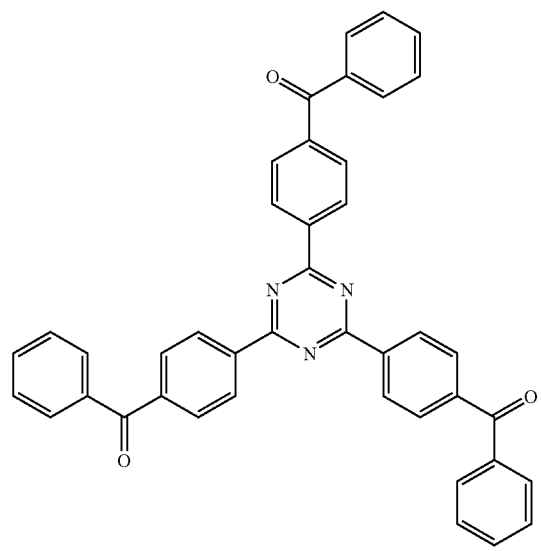
Example 7

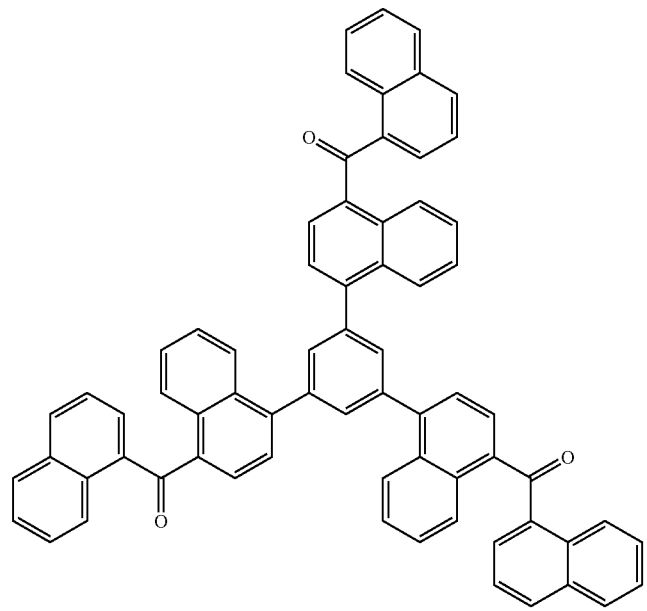
Example 8
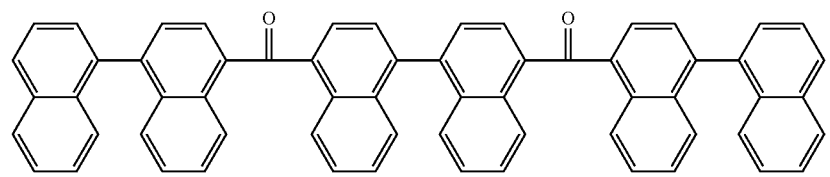
Example 9
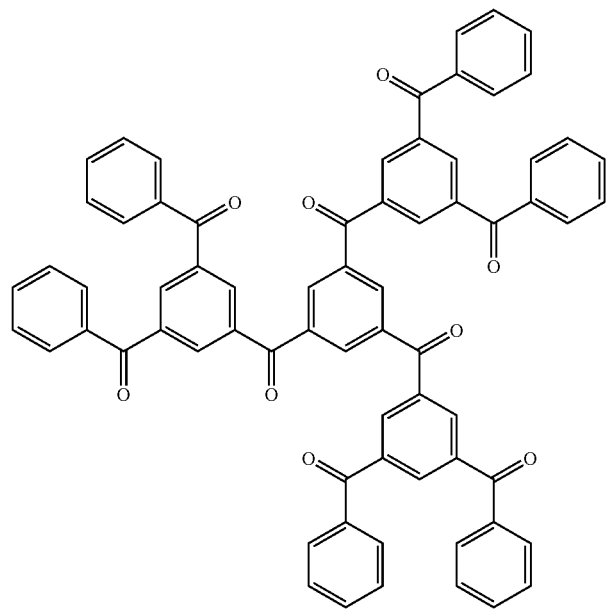
Example 10

-continued
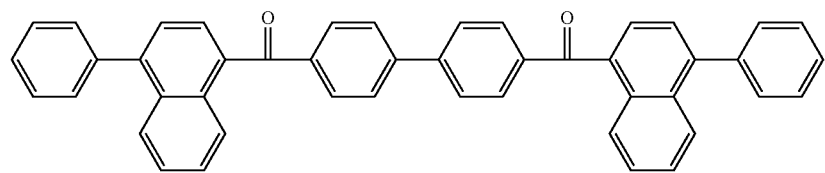
Example 11
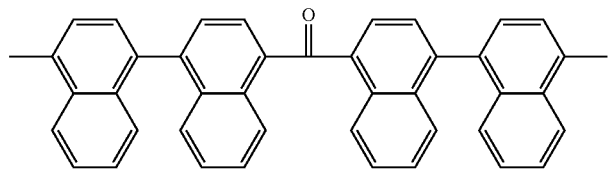
Example 12
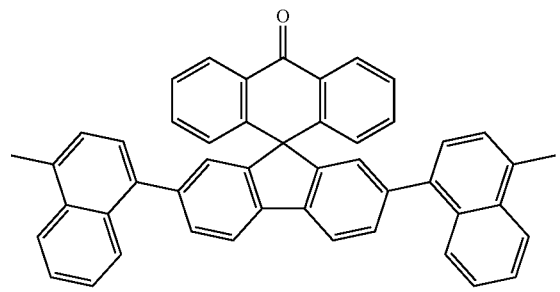
Example 13
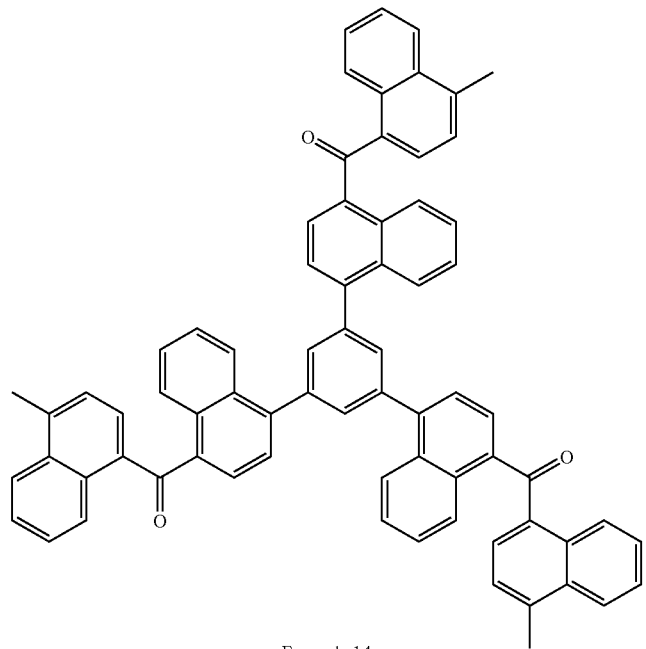
Example 14

-continued
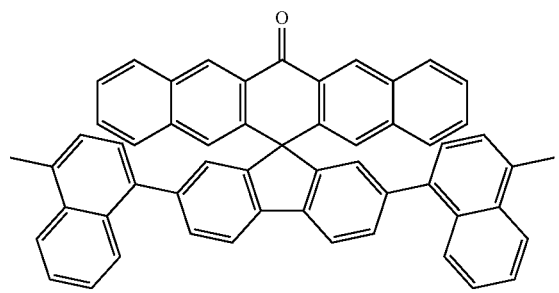
Example 15
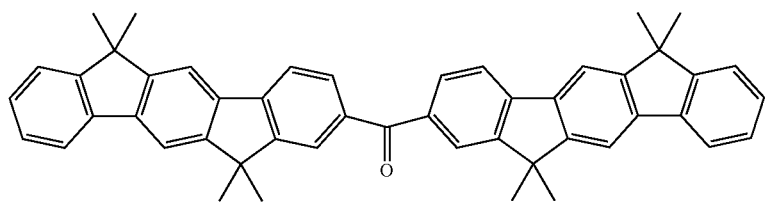
Example 16
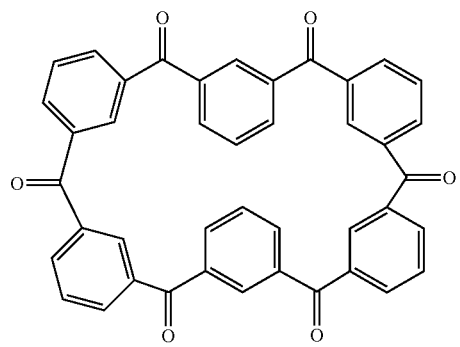
Example 17
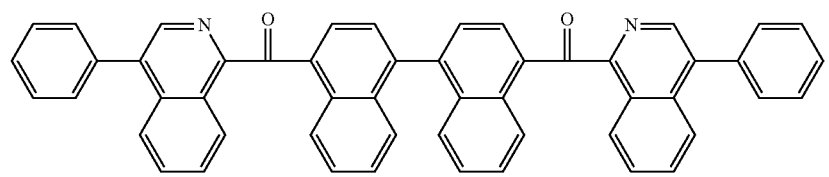
Example 18
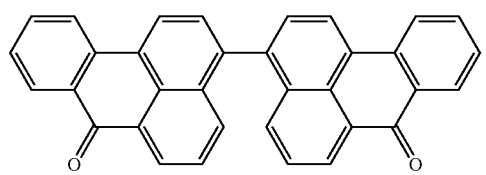
Example 19

-continued
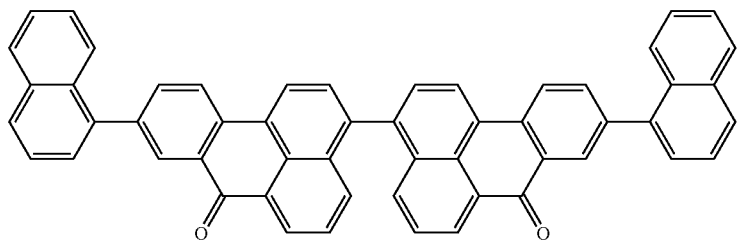
Example 20
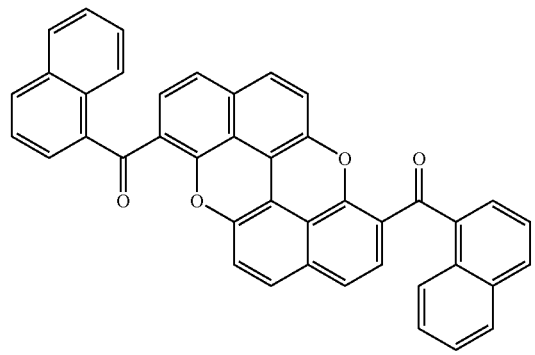
Example 21
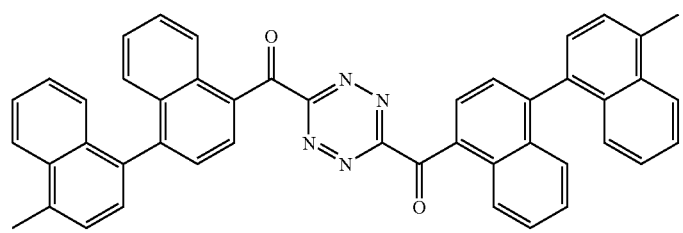
Example 22
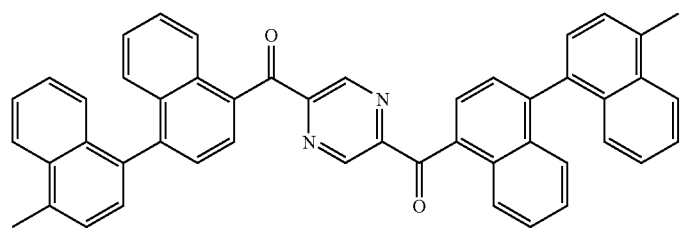
Example 23

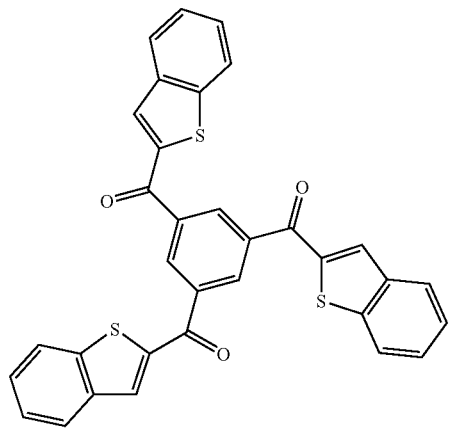
Example 24
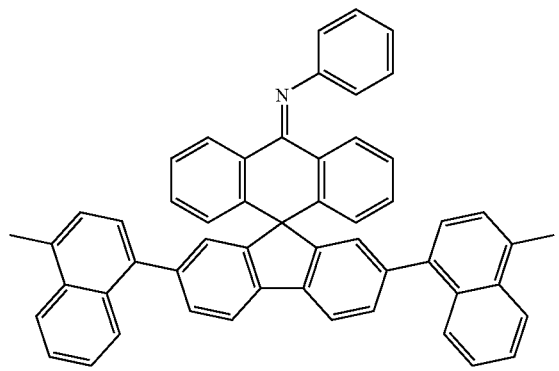
Example 25
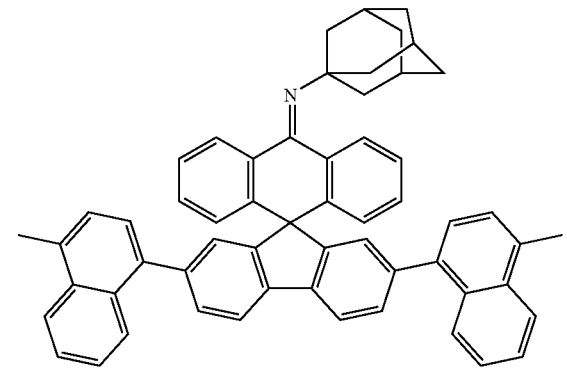
Example 26
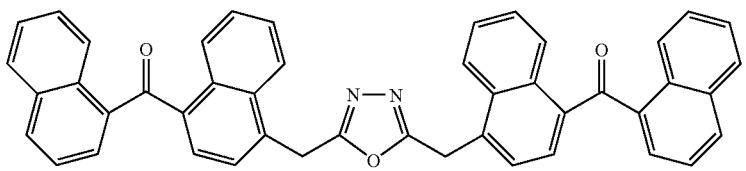
Example 27
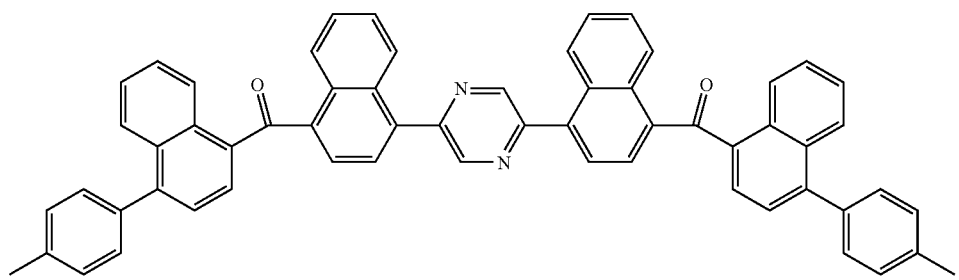
Example 28

Preference is given to the use of the compound of the formula (1) as electron-transport material in an electron-transport layer or in an emission layer. The compound of the formula (1) is particularly preferably employed as electron-transport material in an electron-transport layer. An electron-transport material is a material which predominantly conducts electrons in the electronic device.

Preference is furthermore given to an organic electronic device, characterised in that the layer which comprises the compound of the formula (1) consists of at least 50%, preferably of at least 80% of this compound and very particularly preferably only of the compound of the formula (1) as pure layer. However, the use of a mixture of the compound of the formula (1) and further compounds may also be preferred. The further compounds here may be either organic or inorganic, for example doping with a non-noble metal, such as, for example, alkali and/or alkaline-earth metals, or with an organometallic compound, such as, for example, $Co(Cp)_2$ or $Ni(Cp)_2$.

In particular on use in an emission layer, however, a smaller proportion of the compound of the formula (1) may also be preferred and already brings adequate electron-conduction properties.

In addition to the layer comprising the compound of the formula (1), the organic electronic device may also comprise further layers. These can be, for example: hole-injection layer, hole-transport layer, emission layer, hole-blocking layer, electron-transport layer and/or electron-injection layer. The presence of at least one emission layer is obligatory in an organic electroluminescent device. However, it should be pointed out at this point that each of the above-mentioned layers does not necessarily have to be present.

A preferred aspect of the invention is an organic electroluminescent device according to the invention comprising at least one electron-transport layer between the fluorescent emission layer and the cathode, characterised in that the electron-transport material comprises at least one compound of the formula (1).

The layer thickness of the electron-transport layer is preferably between 5 and 500 nm, particularly preferably between 10 and 100 nm, very particularly preferably between 20 and 70 nm.

Preference is furthermore given to an organic electroluminescent device, characterised in that the emitter(s) in the emission layer fluoresce(s) in the visible spectral region with one or more maxima between 380 nm and 750 nm on suitable excitation. It may also be preferred here for the emitters to have a plurality of different emission maxima, so that white emission results overall.

Preference is furthermore given to an organic electronic device, characterised in that one or more layers are coated by a sublimation process. The materials here are vapour-deposited in vacuum sublimation units at a pressure below $10^{-5}$ mbar, preferably below $10^{-6}$ mbar, particularly preferably below $10^{-7}$ mbar.

Preference is likewise given to an organic electronic device, characterised in that one or more layers are coated by the OVPD (organic vapour phase deposition) process or with the aid of carrier-gas sublimation. The materials are applied here at a pressure between $10^{-5}$ mbar and 1 bar.

Preference is furthermore given to an organic electronic device, characterised in that one or more layers are produced from solution, such as, for example, by spin coating, or by any desired printing process, such as, for example, screen printing, flexographic printing or offset printing, but particularly preferably LITI (light induced thermal imaging, thermal transfer printing) or ink-jet printing.

The emitting devices described above have the following surprising advantages over the prior art:

1. The efficiency of corresponding devices is increased compared with systems which comprise $AlQ_3$ as electron-transport material in accordance with the prior art.
2. The stability of corresponding devices is increased compared with systems which comprise $AlQ_3$ as electron-transport material in accordance with the prior art.
3. The operating voltages are significantly reduced. The power efficiency is consequently increased. This applies, in particular, if a separate electron-transport layer is not used.
4. In particular, blue OLEDs can be produced in better colour purity since the compounds of the formula (1) are colourless and do not impair the efficiency and colour of the OLED due to re-absorption.
5. Since the compounds of the formula (1) are generally not hygroscopic, they can be processed more easily and with less technical complexity compared with $AlQ_3$.
6. Since the compounds of the formula (1) have higher charge-carrier mobility than electron-transport materials in accordance with the prior art, such as, for example, $AlQ_3$, thicker electron-transport layers can be used. This is, as already described above, important for preventing short circuits and is furthermore necessary, in particular, for the combination of fluorescent and phosphorescent OLEDs in a display, since the greater layer thicknesses of the phosphorescent OLEDs must be compensated by a thicker electron-transport layer of the fluorescent OLEDs.

The present application text and also the further examples below are directed, in particular, to organic light-emitting diodes and the corresponding displays. In spite of this restriction of the description, it is possible for the person skilled in the art, without further inventive step, also to use compounds of the formula (1) for other related devices, for example for organic solar cells, organic thin-film transistors, organic field-effect transistors or organic laser diodes.

EXAMPLES

The following syntheses were carried out under a protective-gas atmosphere, unless indicated otherwise. The starting materials (solvents, zinc, zinc cyanide, tetrakis-(triphenylphosphine)palladium(0), phenylmagnesium bromide solution, EDTA, 1-bromonaphthalene, 4-methyl-1-naphthaleneboronic acid, n-BuLi solution 2.5 molar in n-hexane, N,N-dimethylcarbamoyl chloride, 2,7-dibromofluorenone) were purchased from ALDRICH or ABCR. 1,3,5-Tris(4-bromophenyl)benzene was prepared by the method of M. Plater et al., *Perkin* 1 2000, 16, 2695; 1,3,5-tris[[3'-(phenyl-methanoyl)phenyl]methanoyl]benzene was prepared by the method of K. Matsuda et al., *J. Am. Chem. Soc.* 1995, 117, 5550; (2-bromophenylphenyl)methane was prepared by the method of C. Bradsher et al., *J. Org. Chem.* 1948, 13, 786.

Synthesis Example 1

1,3,5-Tris(1'-(4'-benzoyl)phenyl)benzene (electron-transport material E1)

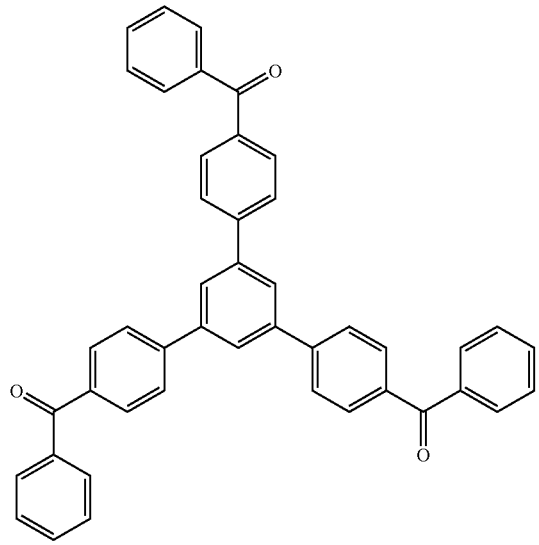

1st Step:

2.9 g (2.5 mmol) of tetrakis(triphenylphosphine)palladium (0) were added with vigorous stirring to a suspension of 135.8 g (250 mmol) of 1,3,5-tris(4'-bromophenyl)-benzene, 93.9 g (800 mmol) of zinc(II) cyanide and 1.6 g of zinc (25 mmol) in 2000 ml of N,N-dimethylacetamide, and the mixture was stirred at 100° C. for 16 h. After cooling, 2000 ml of conc. aqueous ammonia were added to the reaction mixture. The colourless precipitate was filtered off with suction, washed five times with 500 ml of conc. aqueous ammonia each time, three times with 500 ml of water each time and three times with 300 ml of ethanol each time. It was subsequently suspended in 2000 ml of ethanol and washed by stirring under reflux. After the suspension had cooled, the precipitate was filtered off with suction and dried under reduced pressure. Yield: 84.3 g (221 mmol), corresponding to 88.4% of theory, purity 98% (according to NMR).

$^1$H-NMR (CDCl$_3$): δ [ppm]=8.14 (s, 3H), 7.84 (d, 6H), 7.61 (d, 6H).

2nd Step:

330 ml of a phenylmagnesium bromide solution (1.0 molar in THF) were added over the course of 15 min. at room temperature to a suspension of 38.1 g (100 mmol) of 1,3,5-tris(4'-cyanophenyl)benzene in 800 ml of THF. The mixture was subsequently stirred at room temperature for a further 30 min. and stirred under reflux for 5 h. After cooling, 100 ml of 5 N HCl and 100 ml of ethanol were added, and the mixture was again heated under reflux for 16 h. After cooling, the aqueous phase was separated off, the organic phase was evaporated to dryness. The residue was taken up in 1000 ml of dichloromethane and washed five times with 500 ml of water each time. After drying over magnesium sulfate, the organic phase was evaporated to dryness. The residue was recrystallised seven times from DMSO (about 3 ml/g). The sublimation was carried out at T=235° C., p=5×10$^{-5}$ mbar in a static vacuum. T$_m$=199° C., T$_g$=80° C. The yield of 1,3,5-tris(1'-(4'-benzoyl)phenyl)benzene was 32.4 g (52 mmol), corresponding to 52.3% of theory, with a purity of >99.9% (according to HPLC).

$^1$H-NMR (CDCl$_3$): δ [ppm]=7.96 (d, 6H), 7.94 (s, 3H), 7.87 (d, 6H), 7.83 (d, 6H), 7.62 (dd, 3H), 7.51 (dd, 6H).

The absorption edge of E1 is at 351 nm. The determination of the absorption edge is shown in FIG. 1.

Synthesis Example 2

1,3,5-Tris[(3'-benzoyl)benzoyl]benzene (electron-transport material E2)

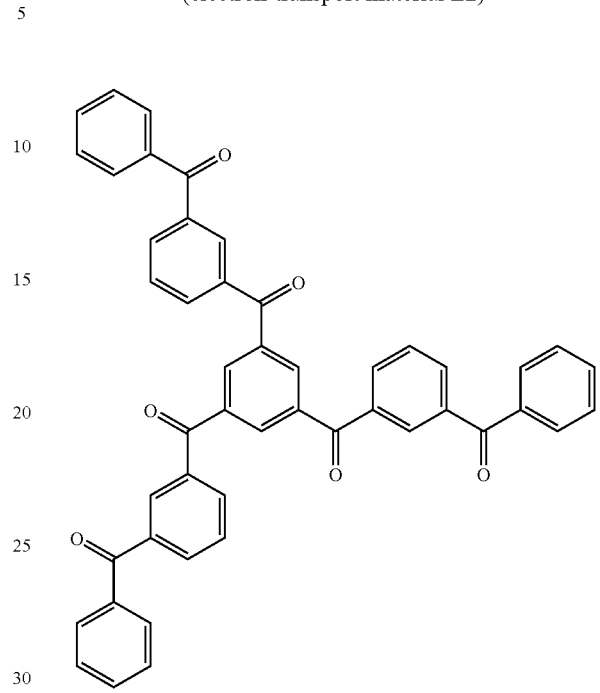

20.0 g of 1,3,5-tris[(3'-benzoyl)benzoyl]benzene, obtained by the procedure of K. Matsuda et al. (see above), having a purity of about 95%, were dissolved in 500 ml of dichloromethane and stirred vigorously for 24 h with 500 ml of a 0.5 molar aqueous solution of EDTA tetrasodium salt in order to remove Cr(III) traces. The organic phase was separated off and washed five times with 300 ml of distilled water. After drying over magnesium sulfate, the organic phase was evaporated and subsequently chromatographed on silica gel (eluent dichloromethane:n-hexane, 3:1). The sublimation was carried out at T=330° C., p=5×10$^{-5}$ mbar in a static vacuum. T$_m$ and T$_g$ could not be determined for the compound obtained in glass-like form. The yield was 14.3 g, with a purity of >99.9% (according to HPLC). The absorption edge of E2 is at 291 nm.

Synthesis Example 3

Electron-Transport Material E3

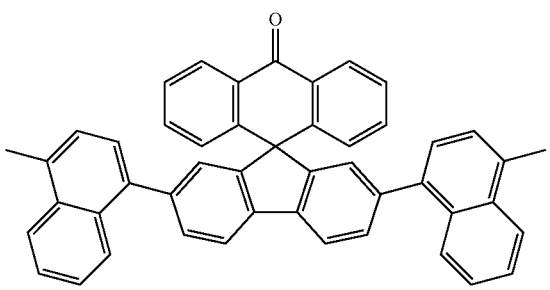

1st Step:

200 ml (500 mmol) of n-BuLi (2.5 molar solution in n-hexane) were added dropwise with vigorous stirring to a mixture, cooled to −78° C., of 123.6 g (500 mmol) of (2-bromophenylphenyl)methane in 2000 ml of THF, and the mixture was stirred for 15 min. This solution was added over the course of 15 min. to a vigorously stirred suspension, cooled to −10° C., of 169.0 g (500 mmol) of 2,7-dibromofluorenone. After the reaction mixture had warmed to room temperature, it was evaporated to dryness under reduced pressure. The honey-like residue was suspended in 2000 ml of glacial acetic acid, 10 ml of conc. hydrochloric acid were added, and the mixture was heated under reflux for 5 h. The precipitated solid was filtered off from the warm reaction mixture (80° C.) and washed with 200 ml of glacial acetic acid. The solid was recrystallised again from 1000 ml of glacial acetic acid. Yield: 198.7 g (407 mmol), corresponding to 81.4% of theory, purity 97% (according to NMR).

$^1$H-NMR (CDCl$_3$): δ [ppm]=7.63 (d, 2H), 7.47 (dd, 2H), 7.39 (br. d, 2H), 7.21 (dd, 2H), 7.11 (d, 2H), 6.96 (dd, 2H), 6.42 (br. d, 2H), 4.48 (s, 2H).

2nd Step:

A suspension of 195.3 g (400 mmol) of the product from the 1st step and 238.4 g (800 mmol) of sodium dichromate dihydrate in 2000 ml of glacial acetic acid was slowly heated to the boil with vigorous stirring and boiled under reflux for 6 h. After cooling, the microcrystalline precipitate was filtered off with suction, washed twice with 200 ml of glacial acetic acid each time, ten times with 200 ml of warm water each time, then three times with 200 ml of ethanol each time and dried under reduced pressure. The crude product obtained in this way was recrystallised twice from chlorobenzene (about 4 ml/g). Yield: 154.6 g (308 mmol), corresponding to 77.0% of theory, purity 99.5% (according to NMR).

$^1$H-NMR (CDCl$_3$): δ [ppm]=8.45 (d, 2H), 7.69 (d, 2H), 7.52 (d, 2H), 7.44 (dd, 2H), 7.32 (dd, 2H), 6.97 (s, 2H), 6.53 (d, 2H).

3rd Step:

1.37 g (4.5 mmol) of tri-o-tolylphosphine and then 168 mg (0.75 mol) of palladium(II) acetate were added to a vigorously stirred suspension of 37.7 g (75 mmol) of the product from the 2nd step, 55.8 g (300 mmol) of 4-methyinaphthalene-1-boronic acid, 78.2 g (315 mmol) of potassium phosphate monohydrate in a mixture of 100 ml of dioxane, 250 ml of toluene and 300 ml of water, and the mixture was heated under reflux for 16 h. After the reaction mixture had cooled, the precipitated solid was filtered off with suction, washed with 100 ml of each of water and ethanol and dried. The solid was placed in a Soxhlett extractor and extracted with chloroform through a glass-fibre extraction thimble (pore size 0.1 μm). The chloroform was concentrated to a volume of 100 ml, and 500 ml of ethanol were added. The resultant precipitate was filtered off with suction and washed with ethanol. The solid was subsequently recrystallised four times from DMF (about 6 ml/g). The sublimation was carried out at T=345° C., p=5×10$^{-5}$ mbar in a static vacuum. T$_m$=329° C., T$_g$=139° C. The yield of the electron-transport material E3 was 36.9 g (59 mmol), corresponding to 78.7% of theory, with a purity of >99.9% (according to HPLC).

$^1$H-NMR (TCE-d2): δ [ppm]=8.34 (m, 2H), 8.06 (d, 2H), 8.00 (d, 2H), 7.71 (d, 2H), 7.61 (d, 2H), 7.49 (dd, 2H), 7.41 (m, 4H), 7.32 (d, 2H), 7.25 (d, 2H), 7.23 (d, 2H), 7.02 (s, 2H), 6.87 (m, 2H), 2.68 (s, 6H).

The absorption edge of E3 is at 383 nm.

Synthesis Example 4

Bis[4-(4'-methylnaphth-1'-yl)naphth-1-yl] ketone

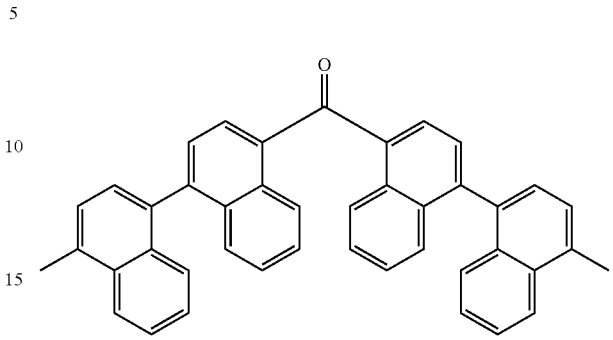

1st Step:

1.83 g (6 mmol) of o-tolylphosphine and then 225 mg (1 mmol) of palladium(II) acetate were added to a vigorously stirred suspension of 93.0 g (500 mmol) of 4-methylnaphthalene-1-boronic acid, 76.5 ml (550 mmol) of 1-bromonaphthalene, 245.2 g (1155 mmol) of tripotassium phosphate monohydrate in a mixture of 500 ml of dioxane, 750 ml of toluene and 1250 ml of water. After boiling under reflux for 16 h and subsequent cooling, the organic phase was separated off, filtered through silica gel and evaporated to dryness. The residue was washed by stirring once with 500 ml of ethanol. Yield: 126.0 g (470 mmol), corresponding to 93.9% of theory, purity 97% (according to NMR).

$^1$H-NMR (CDCl$_3$): δ [ppm]=8.09 (d, 1H), 7.93 (d, 2H), 7.59-7.39 (m, 8H), 7.30-7.25 (m, 2H), 2.80 (s, 3H).

2nd Step:

A mixture of 26.5 ml (517 mmol) of bromine and 500 ml of chloroform was added dropwise to a light-protected solution, cooled to 0° C., of 126.0 g (470 mmol) of 1-(4'-methylnaphth-1'-yl)naphthalene in 1000 ml of chloroform. When the addition was complete, the mixture was stirred at room temperature for a further 14 h. The organic phase was washed with 1000 ml of aqueous saturated sodium sulfite solution and subsequently three times with 300 ml of water each time. After drying over magnesium sulfate and evaporation, the wax-like solid was washed by stirring twice in 500 ml of ethanol under reflux. Yield: 123.3 g (355 mmol), corresponding to 75.5% of theory, purity 98% (according to NMR).

$^1$H-NMR (CDCl$_3$): δ [ppm]=8.35 (d, 1H), 8.10 (d, 1H), 7.88 (d, 1H), 7.58 (dd, 1H), 7.51 (dd, 1H), 7.44-7.28 (m, 7H), 2.80 (s, 3H).

3rd Step:

80 ml (200 mmol) of n-BuLi (2.5 molar solution in n-hexane) were added dropwise to a vigorously stirred suspension, cooled to −78° C., of 69.5 g (200 mmol) of 4-bromo-1-(4-methylnaphth-1-yl)naphthalene in 1000 ml of THF, and the mixture was stirred for 2 h. A mixture of 9.2 ml (100 mmol) of N,N-dimethylcarbamoyl chloride and 100 ml of THF was added dropwise to this suspension. The mixture was subsequently stirred at −78° C. for 1 h. After the mixture had warmed to room temperature, 10 ml of acetic acid and 50 ml of water were added, and the mixture was evaporated to dryness. The oily residue was dissolved in 100 ml of boiling acetone, and 500 ml of acetic acid were slowly added under reflux. After cooling and filtering off with suction, the crude product was recrystallised twice from acetone/acetic acid and seven times from DMSO (about 3 ml/g). The sublimation was carried out at T=340° C., p=5×10$^{-5}$ mbar in a static vacuum. $T_m$=336° C., $T_g$=133° C. The yield of bis[4-(4'-methyl-naphth-1'-yl)naphth-1-yl] ketone was 35.5 g (63 mmol), corresponding to 63.1% of theory, with a purity of >99.9% (according to HPLC).

$^1$H-NMR (CDCl$_3$): δ [ppm]=8.79 (d, 2H), 8.14 (d, 2H), 7.86 (d, 2H), 7.64-7.34 (m, 18H), 2.84 (s, 6H).

The absorption edge of E4 is at 396 nm.

Production of Organic Electroluminescent Devices:

OLEDs were produced by a general process as described in WO 04/058911, which had to be adapted in individual cases to the particular circumstances (for example layer-thickness variation in order to achieve optimum efficiency or colour).

The results of various OLEDs are presented in the following examples. The basic structure, the materials and layer thicknesses used, apart from the electron-transport layer, were identical for better comparability. OLEDs having the following structure were produced analogously to the above-mentioned general process:

| | |
|---|---|
| Hole-injection layer (HIL) | 60 nm PEDOT (spin-coated from water; purchased from H. C. Starck; poly(3,4-ethylenedioxy-2,5-thio-phene) |
| Hole-transport layer (HTL) | 20 nm NaphDATA (vapour-deposited; purchased from SynTec; 4,4',4''-tris(N-1-naphthyl-N-phenylamino)-triphenylamine |
| Hole-transport layer (HTL) | 20 nm S-TAD (vapour-deposited; prepared in accordance with WO 99/12888; 2,2',7,7'-tetrakis(diphenylamino)spiro-9,9'-bifluorene) |
| Emission layer (EML) | spiro-DPVBi (prepared in accordance with WO 02/10093, 2,2',7,7'-tetrakis(2,2'-diphenyl-vinyl)spiro-9,9'-bifluorene) doped with 1% of S-TAD(2,2',7,7'-tetrakis(di-phenylamino)spiro-9,9'-bifluorene) |
| Electron conductor (ETL) | 10 nm-50 nm (precise structure see examples in Table 1) (vapour-deposited: AlQ$_3$ purchased from SynTec; tris(quino-linato)aluminium(III) or electron-transport materials E1 to E4 |
| Ba/Al (cathode) | 3 nm Ba, 150 nm Al on top. |

These still unoptimised OLEDs were characterised by standard methods; for this purpose, the electroluminescence spectra, the efficiency (measured in cd/A), the power efficiency (measured in lm/W) as a function of the brightness, calculated from current-voltage-brightness characteristic lines (IUL characteristic lines), and the lifetime were determined. The lifetime is defined as the time after which the initial brightness of the OLED has dropped to half at a constant current density of 10 mA/cm$^2$. For the electron-transport layer, the layer thickness was optimised separately for each material. For better comparison, however, the greater AlQ$_3$ layer thicknesses, which are directly comparable with the layer thicknesses of E1 and E2, are also shown.

Table 1 shows the results of some examples, with the composition of the ETL including the layer thicknesses also being shown in each case. As electron-transport material, the ETLs comprise, for example, compounds E1 to E4. The comparative examples used are OLEDs which comprise AlQ$_3$ as electron conductor in accordance with the prior art.

For better clarity, the structural formulae of the substances used are shown below:

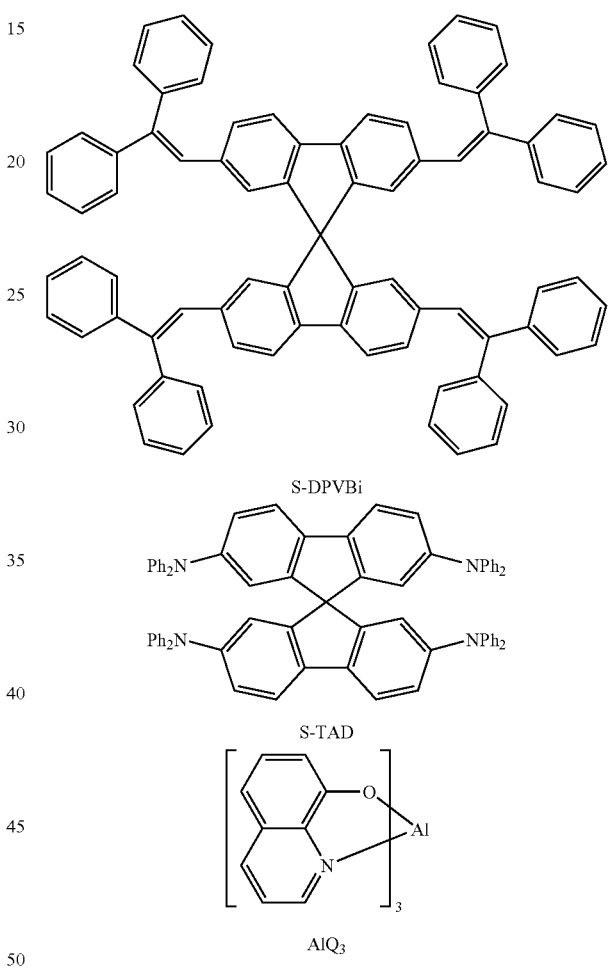

TABLE 1

| Example | EML | ETL | Max. efficiency (cd/A) | Power efficiency @ 100 cd/m$^2$ (lm/W) | CIE (x, y) | Lifetime (h) at 10 mA/cm$^2$ |
|---|---|---|---|---|---|---|
| Example 1 (comparison) | S-DPVBi: 1% S-TAD (30 nm) | AlQ$_3$ (20 nm) | 4.3 | 1.9 | 0.17/0.23 | 640 |
| Example 2 (comparison) | S-DPVBi: 1% S-TAD (30 nm) | AlQ$_3$ (40 nm) | 3.4 | 1.6 | 0.17/0.29 | 610 |
| Example 3 | S-DPVBi: 1% S-TAD (30 nm) | E1 (20 nm) | 4.6 | 2.7 | 0.17/0.22 | 1020 |
| Example 4 | S-DPVBi: 1% S-TAD (30 nm) | E1 (40 nm) | 4.8 | 2.6 | 0.17/0.23 | 960 |

TABLE 1-continued

| Example | EML | ETL | Max. efficiency (cd/A) | Power efficiency @ 100 cd/m² (lm/W) | CIE (x, y) | Lifetime (h) at 10 mA/cm² |
|---|---|---|---|---|---|---|
| Example 5 | S-DPVBi: 1% S-TAD (30 nm) | E2 (20 nm) | 4.7 | 2.5 | 0.17/0.23 | 850 |
| Example 6 | S-DPVBi: 1% S-TAD (30 nm) | E2 (40 nm) | 5.0 | 2.5 | 0.17/0.24 | 810 |
| Example 7 | S-DPVBi: 1% S-TAD (30 nm) | E3 (20 nm) | 4.2 | 2.1 | 0.17/0.22 | 750 |
| Example 8 | S-DPVBi: 1% S-TAD (30 nm) | E3 (40 nm) | 4.1 | 2.0 | 0.17/0.23 | 710 |
| Example 9 | S-DPVBi: 1% S-TAD (30 nm) | E4 (20 nm) | 5.2 | 2.9 | 0.17/0.22 | 1180 |
| Example 10 | S-DPVBi: 1% S-TAD (30 nm) | E4 (40 nm) | 5.1 | 2.7 | 0.17/0.23 | 1090 |

All OLEDs exhibit blue emission originating from the fluorescence emitter S-DPVBi. Higher photometric efficiencies are obtained in devices in which the electron conductor AlQ₃ has been replaced by electron conductors E1 to E4 according to the invention. Since the voltages required to achieve a certain brightness are also low here, very good power efficiency is obtained. The lifetime increases from about 650 h to more than 1100 h. In particular, the efficiencies, the power efficiencies, the lifetime and the colour are better with the electron-transport materials according to the invention than with the standard electron conductor AlQ₃ for the same layer thickness of the ETL.

In summary, it can be stated that OLEDs manufactured in accordance with the novel design principle have higher efficiency at lower voltages and a longer lifetime, as is readily evident from Table 1.

The invention claimed is:

1. Electronic device comprising a cathode, an anode, and at least one organic layer, wherein said organic layer comprises at least one compound of formulae (2) or (3):

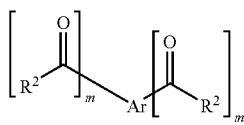

Formula (2)

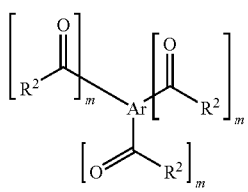

Formula (3)

wherein $R^2$ is on each occurrence, identically or differently, an aromatic ring system having 6 to 40 aromatic C atoms, wherein said aromatic ring system is optionally substituted by one or more radicals $R^3$ or a heteroaromatic ring system having 1 to 40 aromatic C atoms, wherein said heteroaromatic ring system is optionally substituted by one or more radicals $R^3$;

$R^3$ is on each occurrence, identically or differently, H, OH, $N(R^4)_2$, CN, $B(R^4)_2$, $Si(R^4)_3$, a straight-chain, branched or cyclic alkyl or alkoxy chain having 1 to 22 C atoms, in which, in addition, one or more non-adjacent C atoms may be replaced by $-R^4C=CR^4-$, $-C\equiv C-$, $Si(R^4)_2$, $Ge(R^4)_2$, $Sn(R^4)_2$, $-NR^4-$, $-O-$, $-S-$, $-CO-$, $-CO-O-$ or $-O-CO-O-$ and where one or more H atoms may be replaced by fluorine, or an aryl, heteroaryl or aryloxy group having 1 to 40 C atoms, which may also be substituted by one or more radicals $R^4$, or a combination of 2, 3 or 4 of these systems; two or more substituents $R^3$ here may also form a ring system with one another;

$R^4$ is on each occurrence, identically or differently, H or an aliphatic or aromatic hydrocarbon radical having 1 to 20 C atoms;

Ar is on each occurrence, identically or differently, a divalent (in formula (2)) or trivalent (in formula (3)) aromatic or heteroaromatic ring system having 3 to 24 aromatic C atoms, which may be substituted by one or more radicals $R^3$;

m is on each occurrence, identically or differently, 1, 2 or 3;

wherein the compound of formulae (2) or (3) has a molecular weight of ≧390 g/mol and ≦10,000 g/mol and that the device does not comprise a phosphorescent emitter; and furthermore wherein neither $R^2$ nor Ar represents a substituted or unsubstituted spirobifluorene, and with the further provisos that $R^2$ and Ar do not contain a fused aromatic ring system having three or more fused benzene units and that $R^2$ and Ar do not form a mono- or polycyclic ring system with one another; and wherein the absorption edge of the compound of formulae (2) or (3) is <400 nm.

2. Organic electronic device according to claim 1, wherein the absorption edge of the compound of formulae (2) or (3) is <380 nm.

3. Organic electronic device according to claim 1 wherein the device is an organic electroluminescent device, organic thin-film transistor, organic field-effect transistor, organic solar cell, organic photoreceptor or organic laser.

4. Organic electronic device according to claim 1, wherein the compound of formulae (2) or (3) is amorphous and the glass transition temperature $T_g$ of the compound is greater than 80° C.

5. Organic electronic device according to claim 1, wherein the compound of formulae (2) or (3) is selected from the group consisting of example structures 3-11, 14, 17, 18, 21-24, 27, and 28:

Example 3
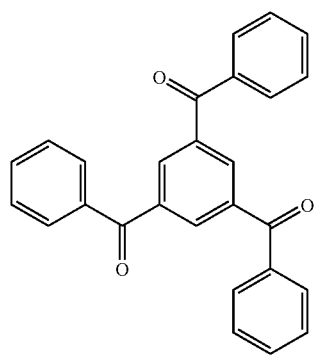
Example 4
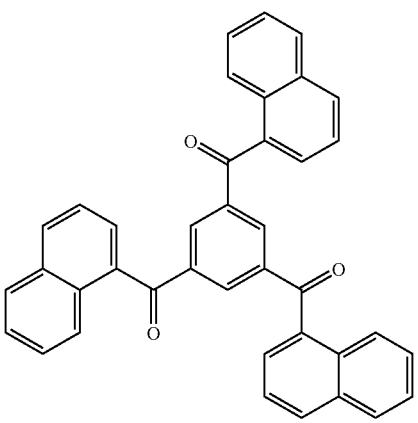
Example 5
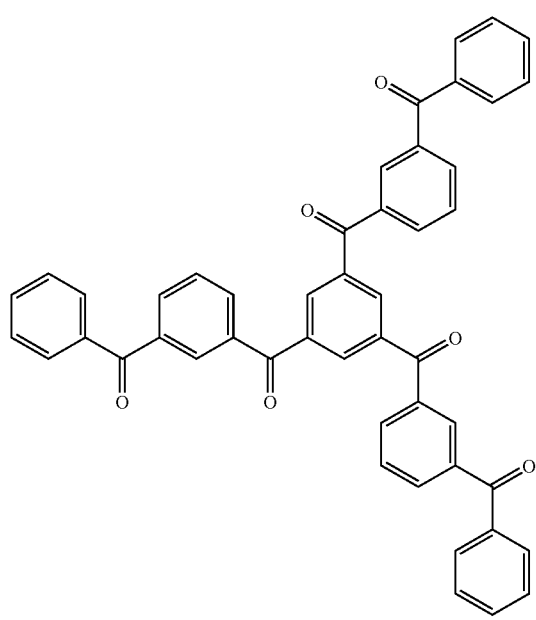
Example 6
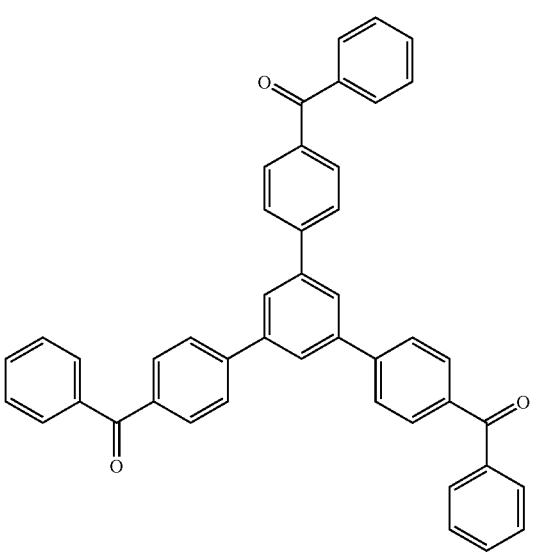
Example 7
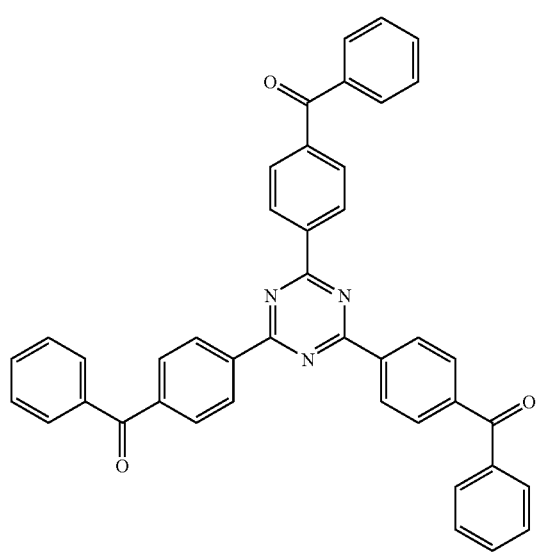
Example 8
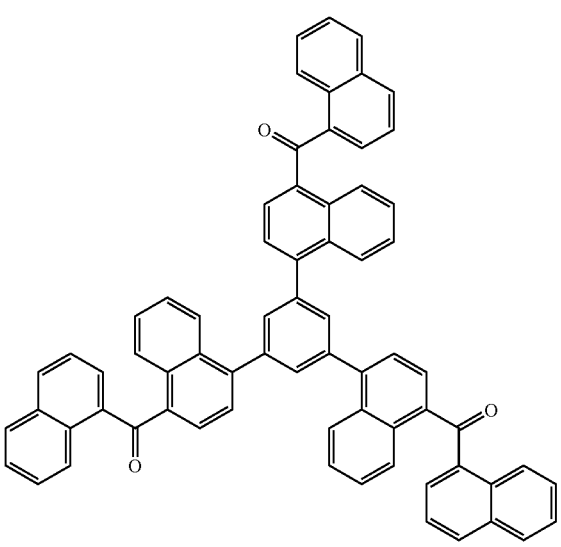

-continued
Example 9
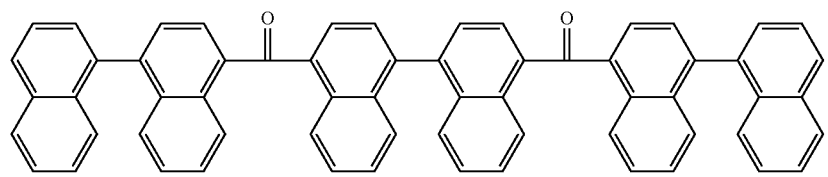
Example 10
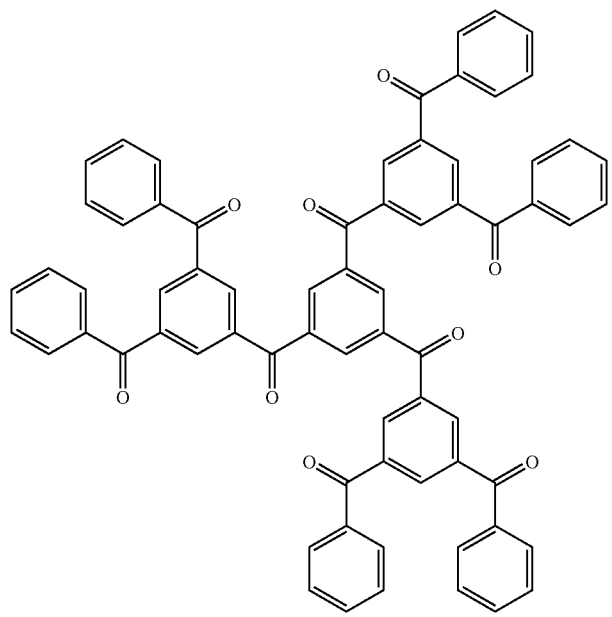
Example 11
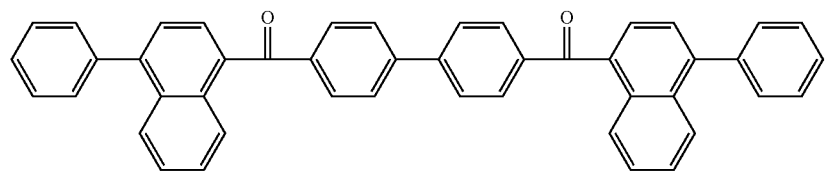
Example 14
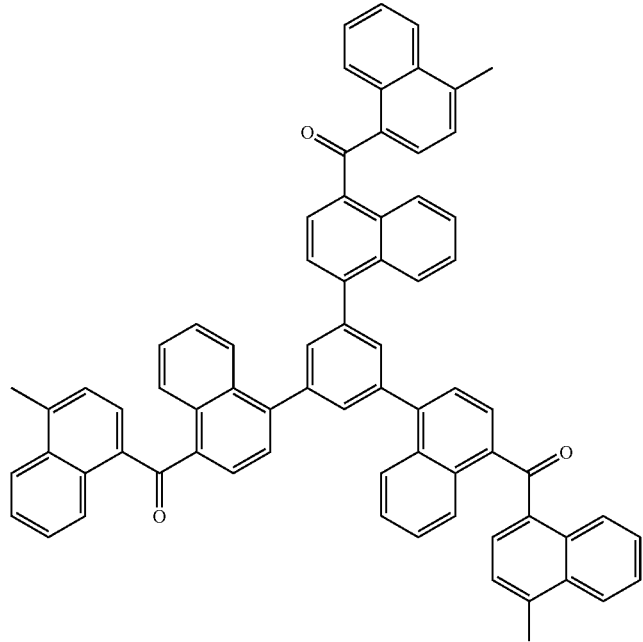

-continued
Example 17
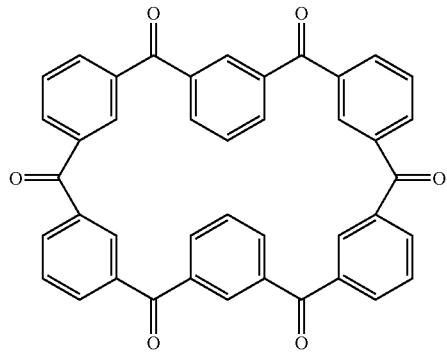
Example 18
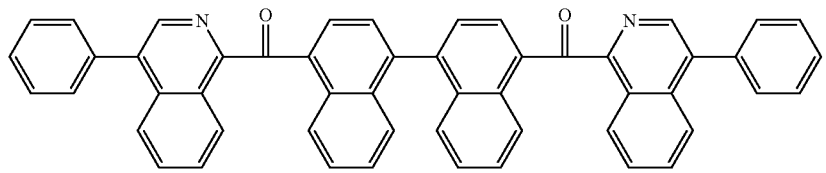
Example 21
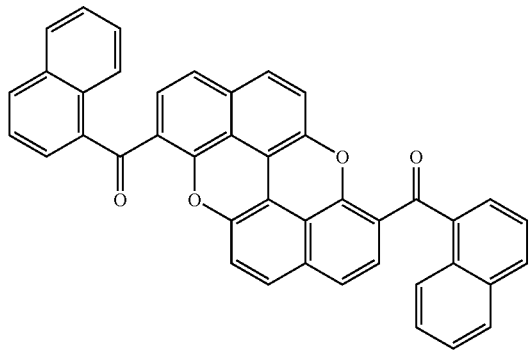
Example 22
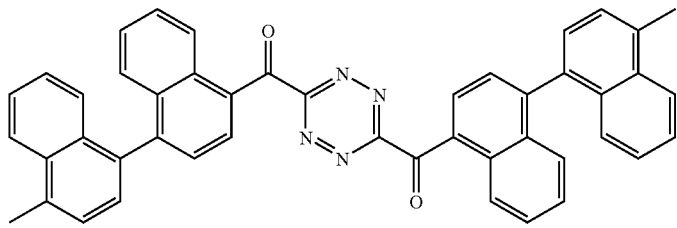
Example 23
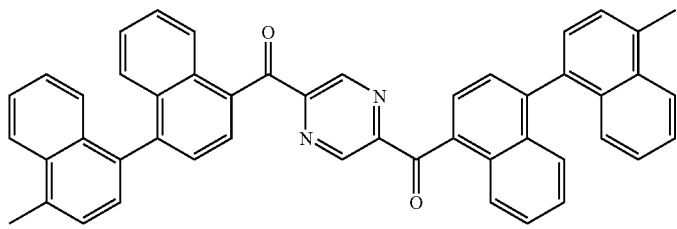

-continued

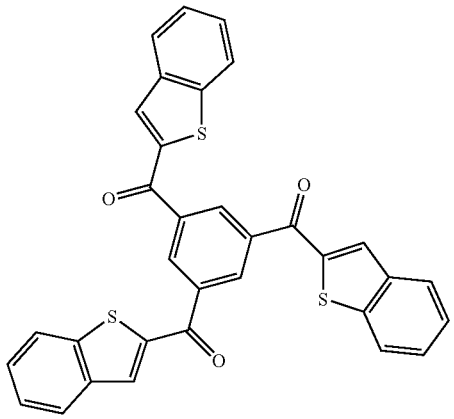
Example 24

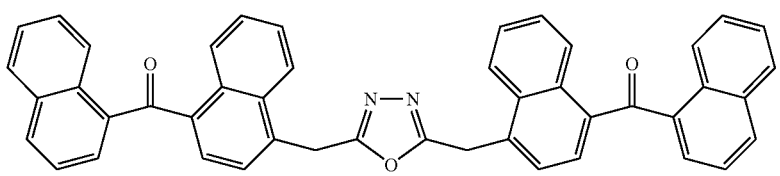
Example 27

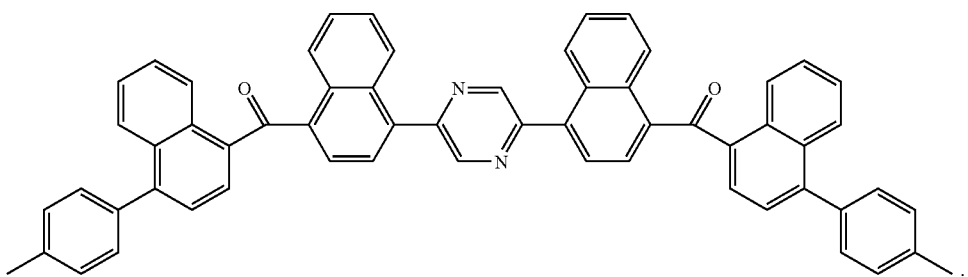
Example 28

6. Organic electronic device according to claim 1, wherein the compound of formulae (2) or (3) is an electron-transport material in an electron-transport layer or in an emission layer.

7. Organic electronic device according to claim 6, wherein the compound of formulae (2) or (3) is an electron-transport material in an electron-transport layer.

8. Organic electronic device according to claim 1, wherein the organic layer comprises at least 50% of the compound of formulae (2) or (3).

9. Organic electronic device according to claim 8, wherein the organic layer consists only of the compound of formulae (2) or (3) as pure layer.

10. Organic electronic device according to claim 1, wherein the device is an organic electroluminescent device in which the emitter(s) fluoresce(s) in the visible spectral region with one or more maxima between 380 nm and 750 nm on suitable excitation.

\* \* \* \* \*